United States Patent [19]

Ho et al.

[11] 4,021,750
[45] May 3, 1977

[54] BROAD-BAND TRAPATT AMPLIFIER HAVING A TAPERED IDLER CIRCUIT

[75] Inventors: Panb-Ting Ho, Lawrenceville; Arye Rosen, Cherry Hill, both of N.J.

[73] Assignee: RCA Corporation, New York, N.Y.

[22] Filed: Dec. 24, 1975

[21] Appl. No.: 644,158

[52] U.S. Cl. .................................. 330/34; 330/53; 330/61 A
[51] Int. Cl.² ......................................... H03F 3/10
[58] Field of Search ............... 330/4.9, 5, 34, 53, 330/61 A; 333/84 M; 331/56, 107 R

[56] References Cited
UNITED STATES PATENTS 3,852,680  12/1974  Rosen et al. ..................... 330/34

Primary Examiner—James B. Mullins
Attorney, Agent, or Firm—Robert M. Rodrick; Joseph D. Lazar; Edward J. Norton

[57] ABSTRACT

A broad-band microwave amplifier including a semiconductor TRAPATT diode generating a microwave signal at its fundamental, second and third harmonic frequencies. Energy is extracted at the second harmonic frequency and a certain impedance loading is provided at the fundamental and third harmonic frequencies by an open-ended tapered microstrip idler circuit connected in parallel with the diode. The tapered idler circuit also provides a predetermined relatively small rate of change of impedance with respect to frequency changes to obtain a wide instantaneous bandwidth of the amplifier.

9 Claims, 5 Drawing Figures

BROAD-BAND TRAPATT AMPLIFIER HAVING A TAPERED IDLER CIRCUIT

The Government has rights in this invention pursuant to Contract No. DAAB07-74-C-0180, awarded by the Department of the Army.

BACKGROUND OF THE INVENTION

1. Field of the Invention

This invention relates to a microwave amplifier and more particularly to a broas-band broad-band amplifier including a semiconductor diode operating in the TRAPATT mode and having a tapered idler circuit to provide a wide instantaneous bandwidth.

2. Description of the Prior Art

Microwave amplifiers having high power and high efficiency and wide bandwidths are desirable, for example, in phased-array radar systems, and communications systems. Prior art amplifiers utilizing TRAPATT diodes have generally required extensive circuit tuning to achieve a broad-band amplifier wherein the instantaneous bandwidth is made as wide as possible without sacrificing gain or efficiency. The instantaneous bandwidth of an amplifier, as known in the art, is the range of input frequencies over which a signal can be amplified at a particular instant of time without any mechanical or electrical adjustments or other tuning.

As is well known, the wave form of a signal generated or amplified by a semiconductor diode operating in the TRAPATT mode is rich in harmonic content. It is generally recognized that a successful TRAPATT amplifier design must provide certain load impedances at the fundamental trapped plasma frequency and at least the second and third harmonic thereof. The impedance loading conditions for such an amplifier are achieved in the prior art typically by using a separate tuned idler circuit for each frequency. For example, each circuit is tuned, i.e., adjusted to have a desired impedance condition, by placing an inductance element in series with a lumped capacitance element as shown in U.S. Pat. No. 3,909,740, issued on Sept. 30, 1975, or by placing tuning stubs in a transmission line as indicated in U.S. Pat. No. 3,848,196 issued on Nov. 12, 1974. In U.S. Pat. No. 3,868,588, issued on Feb. 25, 1975, one of the tuned circuits is eliminated by providing a semiconductor element which is self-resonant at one of the desired frequencies, thereby precluding the need for one of the circuits.

In addition to providing the appropriate impedance loading conditions at the harmonically related frequencies, the idler circuits are also utilized in some devices to provide for an increase in the instantaneous bandwidth. As shown in U.S. Pat. No. 3,852,680, which issued on Dec. 3, 1974, the idler circuits are comprised of rectangular-shaped microstrip transmission lines. Each transmission line has a selected characteristic impedance and a length of substantially one quarter wavelength of the harmonic frequency to which it is related. These distributed transmission lines present a complex impedance for terminating signals at certain harmonic frequencies. It has been found that the operating bandwidth is determined by a relatively small and controllable rate of change of the real and/or reactive portion of the complex impedance with respect to frequency. Such rectangular-shaped quarter wavelength microstrip idler circuits do not provide for as small a rate of impedance change as the present invention and thus result in a narrower instantaneous bandwidth.

SUMMARY OF THE INVENTION

According to the present invention, a broad-band microwave apparatus including a semiconductor diode is provided. The diode, mounted in a transmission line, generates in response to a threshold signal, a microwave signal having fundamental, second and third harmonic frequencies. Energy is extracted at the second harmonic frequency through output means connected to the semiconductor diode. An open-ended idler circuit is connected in parallel with the semiconductor diode. The idler circuit comprises a distributed microstrip transmission line, which has a width varying as a function of the length. The distributed transmission line has sides of unequal length which define a substantially linear taper across the width of the microstrip line at its open end. The idler circuit is arranged to provide a circuit impedance for determining the fundamental frequency of the apparatus. The taper of the idler circuit provides a predetermined rate of change of reactance with respect to frequency for obtaining wide instantaneous bandwidths at the harmonically related frequencies. The combination of the tapered idler circuit and the energy-extracting output means also provides the diode with an impedance of substantially zero at the fundamental frequency, a largely resistive impedance at the second harmonic, and an impedance at the third harmonic greater than the impedance at the second harmonic. These impedance conditions confine the component signals of the fundamental and third harmonic frequencies to the apparatus and allow transmission of the component signal of the second harmonic frequency.

DETAILED DESCRIPTION OF THE PREFERRED EMBODIMENT

Figure 1:
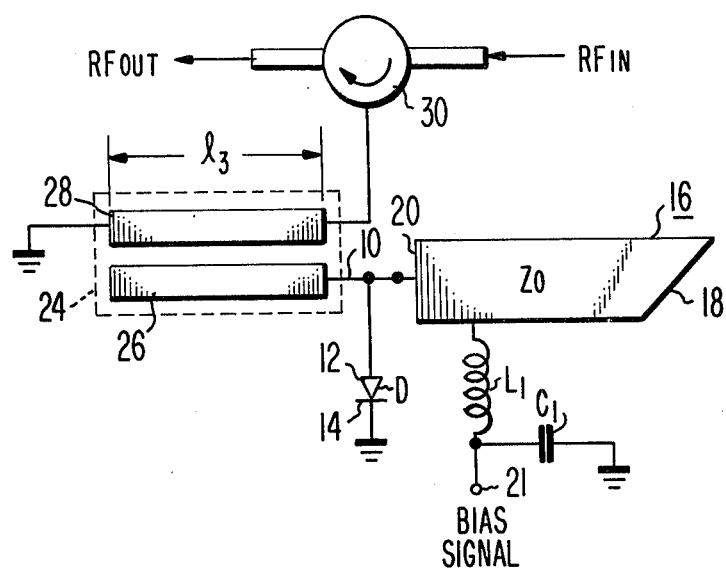
FIG. 1 is a schematic of a preferred embodiment of a microwave amplifier according to the present invention.

Referring now to the drawing, there is shown in FIG. 1 thereof a schematic of a broad-band microwave amplifier in accordance with the present invention. A semiconductor diode D, constructed to operate in the TRAPATT mode such as described in U.S. Pat. No. 3,600,649, is mounted in a transmission line 10. The diode D is connected as by electrodes 12 and 14 between transmission line 10 and ground. By way of illustration, the cathode electrode 14 is connected to ground and the anode electrode 12 is connected to transmission line 10. Preferably, the diode electrode having the better thermal path is connected to ground. Electrically connected to transmission line 10 and in parallel with diode D, is an idler circuit generally indicated by reference numeral 16, having a tapered open end 18.

Figure 2A:
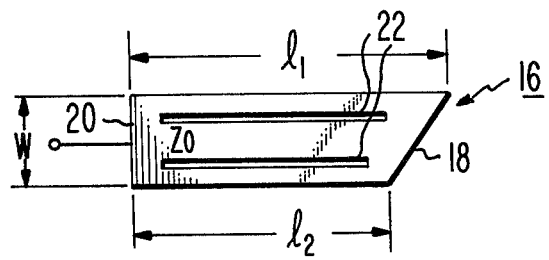
FIG. 2 (a) is a schematic of one embodiment of the tapered idler circuit portion of the amplifier shown in FIG. 1.
FIG. 2(b) is a schematic of another embodiment of the tapered idler circuit.

As shown in FIG. 2a, one embodiment of an idler circuit 16 comprises a section of a distributed microstrip transmission line having a characteristic impedance $Z_0$. The characteristic impedance, $Z_0$, is a function of the width of the microstrip line and the thickness of a dielectric substrate on which it is generally mounted. Idler circuit 16 has a width, W, which may vary as a function of its length, including a curved section, but is preferably substantially constant throughout its length, exclusive of tapered end 18. Idler circuit 16 has sides of unequal lengths, $l_1$ and $l_2$, respectively. Length, $l_1$, is approximately equal to one quarter wavelength at a frequency, $f_1$ and length, $l_2$, is approximately equal to one quarter wavelength at a frequency $f_2$. The range of frequencies from $f_1$ to $f_2$ is the fundamental frequency bandwidth of the amplifier. In this preferred embodiment of the invention, width W is substantially constant throughout length $l_2$, the shorter of the unequal sides.

Figure 3:
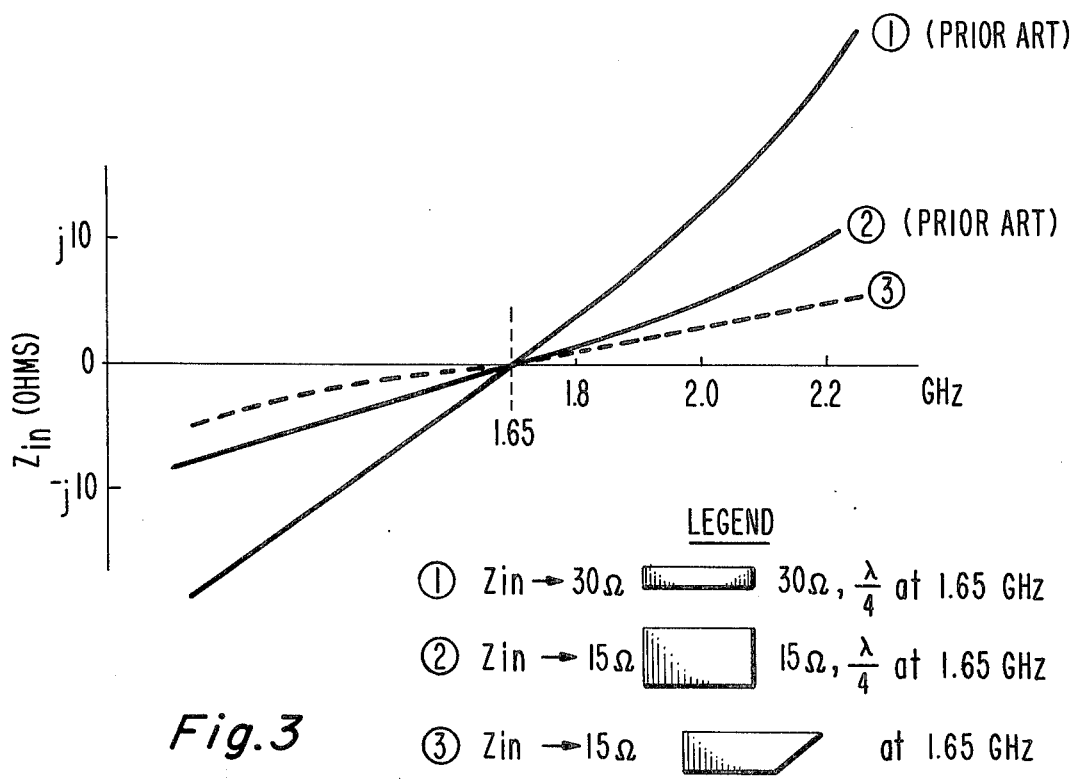
FIG. 3 is a graph showing various parameters of the present invention in comparison with prior art devices.

The sides of idler circuit 16 are made to unequal lengths $l_1$ and $l_2$ to form at the open end 18 a taper which is substantially linear across the width, W. The opposite end 20 of idler circuit 16, which is connected to transmission line 10, is not tapered. The taper is included in idler circuit 16 to provide a wider instantaneous bandwidth of the device over that achieved by the prior art. It has been determined that an improved operating bandwidth of an amplifier is effected by a relatively small and controllable rate of change, with frequency, of the real and/or reactive portion of the impedance presented to a diode by an idler circuit at the selected harmonic frequency. According to the present invention, such a desired rate of frequency vs. impedance change is provided by the taper in the idler circuit. There is shown in FIG. 3 a series of curves of input impedance, $Z_{in}$, as a function of frequency comparing the characteristics of the present invention, with that of two prior art devices to illustrate this effect. The input impedance, $Z_{in}$, can be expressed as $R_L + jX_L$ where $R_L$, the resistive component of the input impedance, is substantially equal to zero for the low loss microstrip idler circuit, whereby $Z_{in} \approx jX_L$. $X_L$ is the reactive portion of the input impedance $Z_{in}$ and for the tapered microstrip idler circuit, $X_L$ can be approximately determined by the following expression:

$$\frac{1}{X_L} = \sum_{i=1}^{n} \left[ \frac{-\tan\beta l_i}{Z_{oi}} \right] \quad (1)$$

In this expression, the tapered idler circuit consists of $n$ sections of varying length rectangular microstrip circuits arranged to approximate the tapered configuration with each of the sections having a very narrow width. The characteristic impedance of each of the sections is represented by $Z_{oi}$, each section having a length represented by $l_i$. $\beta$ is a wave propagation constant of the microstrip line which is equal to $2\pi/\lambda$, where $\lambda$ is the guided wavelength of the propagated wave. The summation of these impedances for $n$ sections provides for a good approximation of the input impedance for the tapered microstrip idler circuit and can be performed iteratively by computer.

Curve 1 represents a prior art idler circuit comprising a non-tapered, i.e., straight rectangular 30 ohm quarter wavelength microstrip at 1.65 GHz, (illustrated under the LEGEND), which provides a curve slope of about 3.5 ohms per 100 MHz. Curve 2 represents another prior art straight idler circuit with a characteristic impedance of 15 ohms. The slope of curve 2 is flatter than the slope of curve 1 and provides for an instantaneous bandwidth that is wider than that of an amplifier having characteristics represented by curve 1. However, the width of the microstrip represented by curve 2 is also approximately equal to a quarter wavelength at 1.65 GHz to achieve such a low (15 ohm) impedance line. Such a wide microstrip is not desirable in microstrip circuit design since it establishes disadvantageously a resonant circuit in both directions of the microstrip. Curve 3 represents the tapered-end microstrip idler circuit embodying the present invention. This tapered circuit is arranged to have a characteristic impedance of 15 ohms. It provides for a multiple resonant characteristic around the fundamental frequency (1.65 GHz) with a flatter (less curve slope) impedance-vs.-frequency response than the prior art idler circuit having the same impedance. Since the rate of change of impedance with respect to frequency changes is smaller than that of the prior art, the instantaneous bandwidth achieved by a tapered open-ended idler circuit of the present invention is wider than prior art circuits having straight open ends.

Referring back to FIG. 2a, it is preferable that one or more slots 22 be formed through microstrip idler circuit 16. Slots 22 are included within the ends 18 and 20 of idler circuit 16 and extend toward open end 18 in the direction of a propagating electromagnetic wave. Either or both of the slots suppress the transverse propagation of electromagnetic waves across the width (W) of idler circuit 16 and thereby prevent undersirable interaction between the standing waves on the microstrip. Depending upon the characteristic impedance selected and the width and lengths of the idler circuit 16, more than one slot (22) may be formed to suppress the transverse propagation of the electromagnetic waves.

Figure 2B:
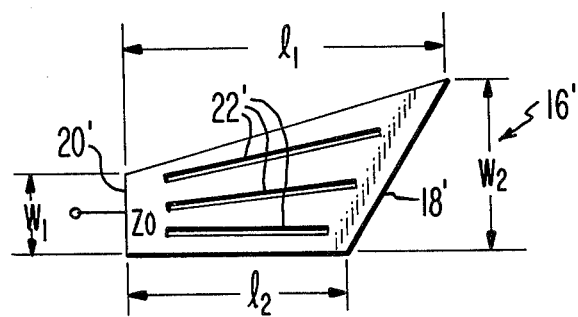

In another embodiment as shown in FIG. 2b, an idler circuit 16' may be made of sides of unequal lengths $l_1$ and $l_2$ to form a linear tapered end 18' similar to that shown in FIG. 2a. The width is formed to increase substantially linearly from $W_1$ at end 20' to $W_2$ at end 18'. The increase in the width together with the taper at end 18' produces a curve of impedance-vs.-frequency response which is flatter than the constant-width tapered-end idler circuit represented by curve 3 (FIG. 3) and hence increases the instantaneous bandwidth. At least one slot 22' may be formed in this idler circuit similar to the slots described in FIG. 2a to minimize the effects of transverse propagation of waves.

As described above, with the development of the TRAPATT diodes, transmission line circuitry has to be designed to support not only the fundamental operating frequency of the device but up to at least the third harmonic frequency. Many of the prior art amplifiers utilizing TRAPATT diodes are fabricated to permit power extraction at any harmonically related frequency, despite losses in efficiency, by presenting the diode with a certain load impedance to meet operating conditions. Ideally, the load impedance is chosen to be either zero, infinite, or purely reactive at the unwanted frequencies and largely resistive at the desired harmonic frequency, thus confining the unwanted harmonic frequency signals to the internal operation of the apparatus, while passing only the desired harmonic to an external load in a manner well known in the art. Because of problems associated with the circuitry required to operate at high frequencies, especially at the second and third harmonics, as well as the difficulty in obtaining diodes with a suitable resistivity region, many of the prior art devices preferably have power extracted at the second harmonic although power may be extracted at any related harmonic frequency.

In accordance with the present invention, power is extracted from the amplifier only at the second harmonic frequency. It has been found that for power extraction at the second harmonic frequency of a TRAPATT amplifier the diode requires a low impedance loading at the fundamental frequency, a resistive loading at the second harmonic, and an impedance at the third harmonic frequency which is greater than the impedance at the second harmonic. The taper at the open end 18 of idler circuit 16 provides these impedance conditions at the fundamental and third harmonic frequencies and the circuit output means, preferably a coupled-bar transformer as will be described, provides the suitable resistive loading at the second harmonic frequency. Thus, contrary to the prior art, other separate idler circuits or additional tuning elements are not required for power to be extracted at the second harmonic frequency in accordance with the present invention.

Referring back now to FIG. 1, a coupled-bar transformer 24 is shown electrically connected to transmission line 10 and to diode D and is arranged to provide for transmission of a signal component at the second harmonic frequency to terminating load impedance, typically 50 ohms and not shown. Coupled-bar transformer 24 comprises center conductor 26, which is electrically connected to transmission line 10 on one end and open at the other end. Capacitively coupled to center conductor 26 is center conductor 28. The end of center conductor 28 adjacent to the open-circuited end of center conductor 26 is connected to ground. Center conductor 28 has an electrical length $l_3$ which is selected to transmit the input frequency. The characteristic impedance of center conductors 26 and 28, the magnitude of capacitive coupling between these center conductors, and the electrical lengths of center conductors 26 and 28 are disigned to provide the diode D with the desirable resistive termination at the second harmonic of the fundamental frequency of operation.

A directional circulator 30, connected near the open end of center conductor 28, is preferably used to couple microwave energy from an external source (not shown) to diode D. A pulsed or D.C. reverse bias signal from an external source (not shown) is applied across electrodes 12 and 14 of diode D through an $L_1C_1$ biasing circuit via terminal 21. The magnitude of the applied pulse or D.C. bias signal is slightly less than the diode threshold voltage necessary for operation. The applied microwave signal ($RF_{in}$) combines with the applied pulsed or D.C. reverse bias voltage and triggers the diode D into the TRAPATT mode of operation, generating a microwave signal rich in harmonics. The second harmonic frequency is equal to the frequency of the applied microwave signal ($RF_{in}$). Thus, the frequency of the applied microwave signal is equal to the desired output ($RF_{out}$).

Figure 4:
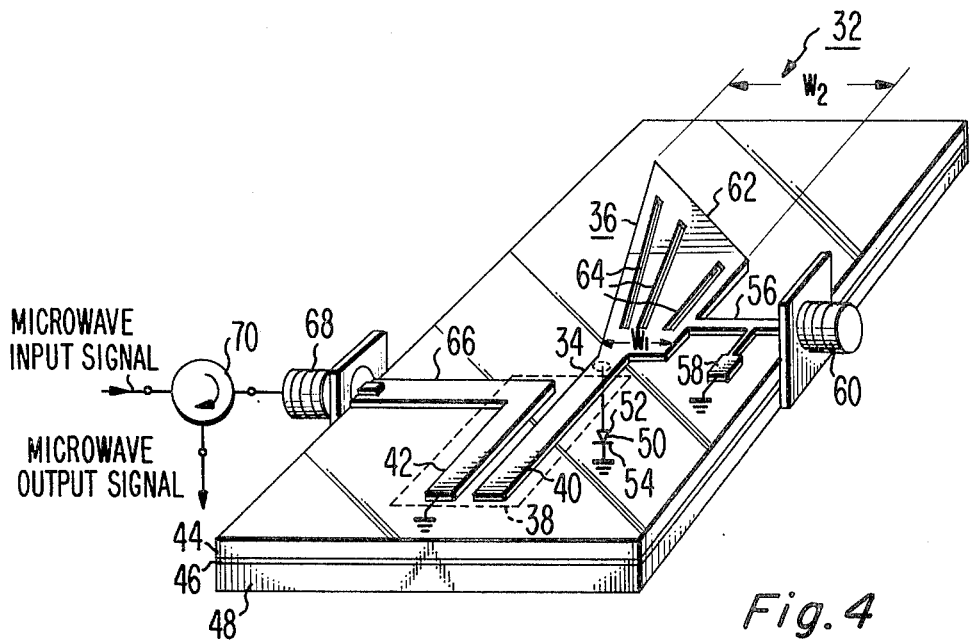
FIG. 4 is an isometric view of a microwave amplifier constructed according to the present invention utilizing the idler circuit shown in FIG. 2b.

Referring to FIG. 4, there is shown an isometric view of a microwave amplifier 32 utilizing the idler circuit of FIG. 2b. Transmission line 34, idler circuit 36 (corresponding to idler circuit 16'), and center conductors 40 and 42 of coupled-bar transformer 38 are microstrip lines suibably formed of conductive strips on the top surface of a dielectric substrate 44. The bottom surface of substrate 44 is bonded to a ground plane 48, preferably by a solder-bond 46. Mounted in transmission line 34 is a TRAPATT diode 50 shown schematically having electrodes 52 and 54, electrode 54 being connected to ground. A bias lead line 56 defining an inductance ($L_1$) and a capacitor 58 having a capacitance ($C_1$), capacitor 58 being electrically connected to lead line 56, provide a bias circuit for applying a bias voltage across diode electrodes 52 and 54. Line 56 is connected to bias connector 60 to apply the bias voltage from an external source, not shown.

Idler circuit 36 has an open end 62, which is tapered, and the width of the idler circuit increases from $W_1$ at the connection to transmission line 34 to $W_2$ at the tapered open end 62. Three slots 64 formed through idler circuit 36 extend within the microstrip idler circuit 36 in the direction of the open end 62.

center conductor 42 of the coupled-bar transformer 38 is connected by lead line 66 to a connector 68 coupled to a microwave signal. A directional circulator 70 is connected to connector 68 to apply the microwave signal to amplifier 32.

A TRAPATT amplifier in accordance with FIG. 4 wherein the microwave output signal is at the second harmonic frequency operates with a significantly wide instantaneous bandwidth. For an amplifier having a TRAPATT diode with a fundamental frequency of 1.65 GHz, at the second harmonic frequency the instantaneous bandwidth is 265 MHz. This performance, it will be appreciated, is a significant improvement over the bandwidths achieved with prior art devices.

It will now be appreciated that in accordance with the present invention having an idler circuit with a tapered open end the idler circuit achieves two significant performance characteristics. First, the slope of impedance vs. frequency characteristic curve plot is less than that achieved by straight, rectangular quarter wavelength idler circuits having the same impedance. The reduced slope results in a smaller rate of change of impedance with respect to frequency and increases the instantaneous bandwidth of the amplifier as compared to an amplifier having a non-tapered idler circuit. Second, the impedance environment to the diode effects suppression of the fundamental and third harmonic frequencies of the diode modes and enhances the generation of the second harmonic without the need of additional separate idler circuits or supplemental tuning elements.

What is claimed is:

1. A broad-band microwave apparatus of the type including a transmission line, a semiconductor element in said line for generating, in response to a threshold signal, a microwave signal having fundamental, second and third harmonically related frequency components means for applying said threshold signal to said semiconductor element, and output means to provide a substantially resistive impedance electrically connected to said semiconductor element for transmitting a signal component at a frequency corresponding to said second harmonic frequency to a terminating load impedance, wherein the improvement comprises:
    an open-ended idler circuit connected in parallel with said semiconductor element,
    said idler circuit comprising a distributed microstrip transmission line having a width which is a function of the length, and having sides of unequal length, said distributed transmission line having thereby a substantially linear taper across the open end of said idler circuit, whereby said apparatus provides said microwave signal to said terminating load only at said second harmonic frequency.

2. A broad-band microwave apparatus according to claim 1, wherein the width of said distributed microstrip transmission line is substantially constant throughout the length of the shorter of said unequal sides.

3. A broad-band microwave apparatus according to claim 1, wherein the width of said distributed microstrip transmission line increases substantially linearly with the length in the direction of the open end of said tapered idler circuit.

4. A broad-band microwave apparatus according to claim 1, further including at least one slot through and extending within said distributed microstrip transmission line in the direction of the tapered end of said idler circuit, wherein said slot suppresses the transverse propagation of electromagnetic waves across the distributed microstrip transmission line to reduce interaction between the modes of wave propagations.

5. A broad-band microwave apparatus according to claim 1, wherein said semiconductor element is a diode adapted to operate in the TRAPATT mode.

6. a broad-band microwave apparatus according to claim 5, wherein said threshold signal is the sum of a pulsed or D.C. reverse bias voltage, having a magnitude less than a predetermined threshold value, and an RF voltage of an applied microwave input signal, said sum having a magnitude exceeding said threshold value whereby said diode is triggered into amplifying said microwave input siganl.

7. A broad-band microwave apparatus according to claim 1, wherein said output means comprises an output impedance matching transformer.

8. A broad-band microwave apparatus according to claim 7, wherein said output impedance matching transformer comprises a coupled-bar transformer.

9. A broad-band microwave apparatus according to claim 1, wherein said transmission line and said output means are microstrip transmission lines.

* * * * *

UNITED STATES PATENT OFFICE
CERTIFICATE OF CORRECTION

PATENT NO. : 4,021,750

DATED : May 3, 1977

INVENTOR(S) : Pang-Ting Ho and Arye Rosen

It is certified that error appears in the above-identified patent and that said Letters Patent are hereby corrected as shown below:

Title page, Inventors name, "Panb" should be --Pang--;
Column 1, line 11, delete "broas-band";
Column 1, line 11, after broad-band insert "microwave";
Column 4, line 53, "has" should be --had--;
Column 5, line 43, "disigned" should be --designed--.

Signed and Sealed this second Day of August 1977

[SEAL]

Attest:

RUTH C. MASON
Attesting Officer

C. MARSHALL DANN
Commissioner of Patents and Trademarks